(12) United States Patent
Zhou et al.

(10) Patent No.: US 10,985,534 B2
(45) Date of Patent: Apr. 20, 2021

(54) POWER AND SPECTRAL MONITORING IN WAVELENGTH BEAM COMBINING LASER SYSTEMS

(71) Applicant: PANASONIC INTELLECTUAL PROPERTY MANAGEMENT CO. LTD, Osaka (JP)

(72) Inventors: Wang-Long Zhou, Andover, MA (US); Bryan Lochman, Somerville, MA (US); Bien Chann, Merrimack, NH (US)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 43 days.

(21) Appl. No.: 16/417,861

(22) Filed: May 21, 2019

(65) Prior Publication Data
US 2019/0363518 A1   Nov. 28, 2019

Related U.S. Application Data

(60) Provisional application No. 62/674,652, filed on May 22, 2018.

(51) Int. Cl.
| | |
|---|---|
| *H01S 5/40* | (2006.01) |
| *G02B 27/10* | (2006.01) |
| *H01S 5/0687* | (2006.01) |
| *H01S 5/06* | (2006.01) |
| *H01S 5/14* | (2006.01) |
| *H01S 5/068* | (2006.01) |

(Continued)

(52) U.S. Cl.
CPC ........ *H01S 5/4012* (2013.01); *G02B 27/1086* (2013.01); *H01S 5/0607* (2013.01); *H01S 5/0687* (2013.01); *H01S 5/141* (2013.01); *H01S 5/4062* (2013.01); *H01S 5/4087* (2013.01); *H01S 3/0941* (2013.01); *H01S 3/094003* (2013.01); *H01S 5/06825* (2013.01)

(58) Field of Classification Search
CPC .... H01S 5/0683; H01S 5/0687; H01S 5/0607; H01S 5/4012; H01S 5/4087; G02B 27/1086
See application file for complete search history.

(56) References Cited

U.S. PATENT DOCUMENTS

| | | | |
|---|---|---|---|
| 6,907,051 | B1 | 6/2005 | Farmer |
| 9,310,560 | B2 | 4/2016 | Chann et al. |
| 9,366,887 | B2 | 6/2016 | Tayebati et al. |

(Continued)

FOREIGN PATENT DOCUMENTS

| | | | | |
|---|---|---|---|---|
| CN | 103151696 | | 6/2013 | |
| JP | 6437172 B1 | * | 12/2018 | ............ H01S 65/40 |
| WO | WO-2019193640 A1 | * | 10/2019 | ............ H01S 5/14 |

OTHER PUBLICATIONS

International Search Report for corresponding International Application No. PCT/IB2019/000618, dated Jan. 6, 2020, 7 pages.

*Primary Examiner* — Tod T Van Roy
*Assistant Examiner* — Sean P Hagan
(74) *Attorney, Agent, or Firm* — Morgan, Lewis & Bockius LLP

(57) ABSTRACT

In various embodiments, monitoring of one or more secondary diffracted beams formed within a laser resonator provides information based at least in part on which a primary diffracted beam formed within the laser resonator is controlled.

28 Claims, 5 Drawing Sheets

(51) Int. Cl.
  *H01S 3/094*  (2006.01)
  *H01S 3/0941*  (2006.01)

(56) References Cited

U.S. PATENT DOCUMENTS

| | | |
|---|---|---|
| 9,435,964 B2 | 9/2016 | Tayebati et al. |
| 9,719,776 B2 | 8/2017 | Tayebati |
| 9,778,448 B2 | 10/2017 | Chann et al. |
| 9,889,524 B2 | 2/2018 | Tayebati et al. |
| 10,088,632 B2 | 10/2018 | Zhou et al. |
| 10,268,043 B2 | 4/2019 | Zhou et al. |
| 10,401,633 B2 | 9/2019 | Zhou et al. |
| 10,727,648 B2 * | 7/2020 | Dejima ............ H01S 5/4012 |
| 2008/0084605 A1 | 4/2008 | Rothenberg et al. |
| 2012/0014397 A1 * | 1/2012 | Chann ............ H01S 3/2308 372/18 |
| 2014/0036358 A1 | 6/2014 | Chann et al. |
| 2015/0333485 A1 * | 11/2015 | Tayebati ............ H01S 3/08 359/487.04 |
| 2016/0344162 A1 * | 11/2016 | Konno ............ C03B 23/20 |
| 2017/0052381 A1 | 2/2017 | Tayebati et al. |
| 2017/0304942 A1 | 10/2017 | Ogata |
| 2017/0368638 A1 | 12/2017 | Tayebati et al. |

* cited by examiner

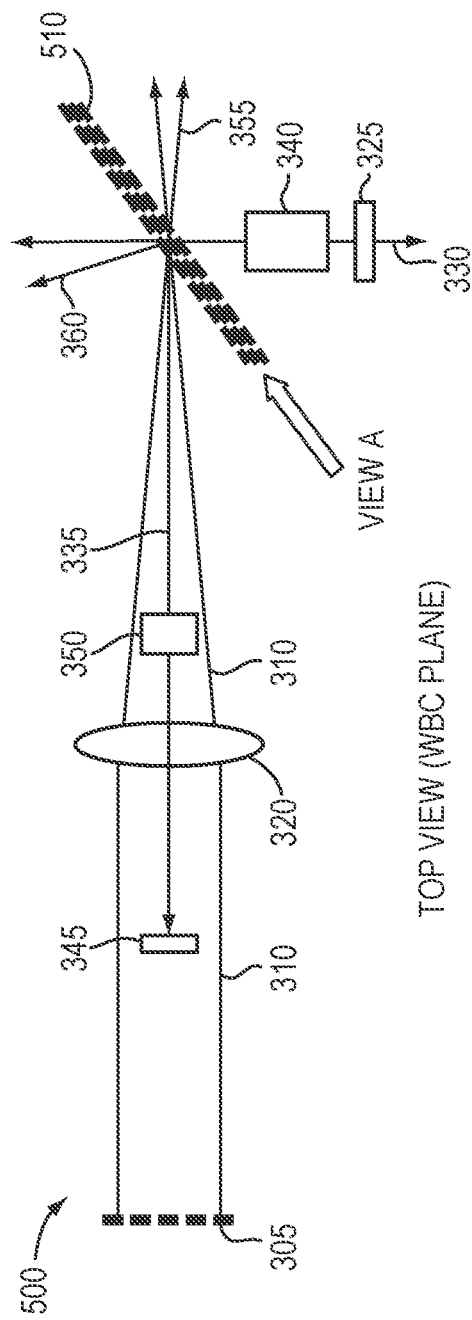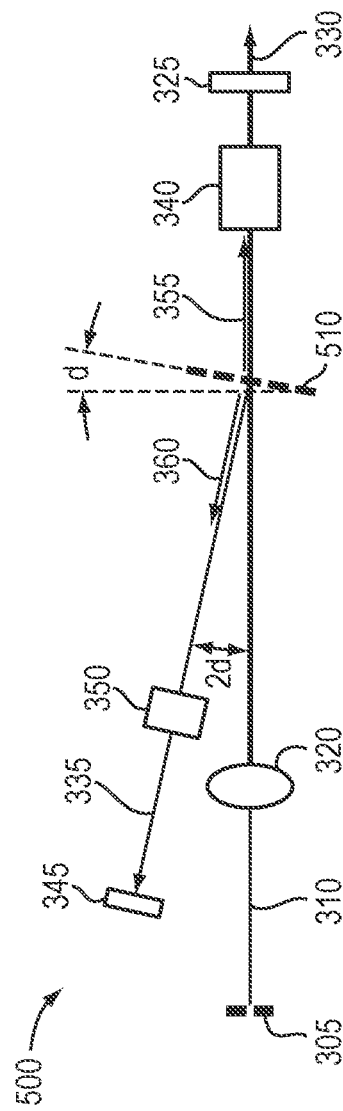
FIG. 5A TOP VIEW (WBC PLANE)
FIG. 5B SIDE VIEW (NON-WBC PLANE, VIEW A)

POWER AND SPECTRAL MONITORING IN WAVELENGTH BEAM COMBINING LASER SYSTEMS

RELATED APPLICATIONS

This application claims the benefit of and priority to U.S. Provisional Patent Application No. 62/674,652, filed May 22, 2018, the entire disclosure of which is hereby incorporated herein by reference.

TECHNICAL FIELD

In various embodiments, the present invention relates to laser systems, particularly wavelength beam combining laser systems featuring multiple input beams.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. The optical system is typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

Wavelength beam combining (WBC) is a technique for scaling the output power and brightness from laser diode bars, stacks of diode bars, or other lasers arranged in one- or two-dimensional array. WBC methods have been developed that combine beams along one or both dimensions of an array of emitters. Typical WBC systems include multiple emitters, such as one or more diode bars, that are combined using a dispersive element (e.g., a diffraction grating) to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

High-power WBC lasers may combine emitted input beams from tens or even hundreds of beam emitters such as semiconductor emitters. These emitters will degrade in performance over time, optical surfaces within the laser system may become damaged or contaminated during operation, and the WBC resonator itself may lose alignment over time—any of these phenomena may result in output power fluctuations of the WBC system. One way to monitor WBC resonator output power is detection of the level of stray light within the resonator housing, which is relatively easy and convenient. Such stray light mainly arises from laser diode simultaneous emissions, beam clippings on optics, wavelength-unlocked light, and scattering and reflections from optics. However, due to the many possible contributors to stray light, the level of stray light might not directly reflect WBC resonator power. For example, when a large contribution to the stray light is wavelength-unlocked, the level of stray light may be uncorrelated, or even inversely correlated, to the resonator output power.

Another technique for monitoring WBC resonator power is detecting the level of scattering of the main WBC beam from optics or air. However, this method is sensitive to surface defects and air turbulence and is also affected by back reflections from optics and/or objects outside the resonator. An additional way to monitor WBC resonator power is detecting a weak beam tapped off from the main beam via insertion of extra optics into the main optical path. Such optics, especially for kW-level high-power WBC resonators, typically require anti-reflection coatings on both surfaces with a low reflectivity (e.g., <0.1%) for both polarizations over a relative broad WBC wavelength band. The actual reflectivity of the optics may be affected by environmental changes, such as changes in temperature and humidity, and possible degradation of coated surfaces. Therefore, variations of power detected via this method may not reflect actual fluctuations of WBC power. In view of the foregoing, there is a need for innovation directed toward power monitoring of WBC laser systems.

SUMMARY

In various embodiments, the present invention enables the monitoring of power (e.g., power fluctuations and/or power level or magnitude) of WBC laser systems via detection of one or more otherwise unused diffracted beam arising from the dispersive element (e.g., a diffraction grating) in the WBC optical path. Advantageously, the monitored beam is or may be spatially separated from the WBC resonator, and the beam may be wavelength-locked and spatially combined. Thus, in various embodiments, the monitored beam possesses the same characteristics as the main diffracted output beam of the WBC resonator, but the detection and use of the beam does not diminish the output power level of the resonator. In addition, the detected beam is substantially unaffected by wavelength-unlocked light and/or back reflections that may arise within the resonator housing. Finally, spectral changes may be monitored via the detected beam. Since each emitter in the WBC resonator operates at its own unique wavelength, spectral monitoring enables the identification of issues with or fluctuations of individual emitters within the WBC system.

In embodiments of the invention, beam emitters (or simply "emitters") may include, consist essentially of, or consist of diode lasers, fiber lasers, fiber-pigtailed diode lasers, etc., and may be packaged individually or in groups as one- or two-dimensional arrays. In various embodiments, emitters or emitter arrays are high-power diode bars with each bar having multiple (e.g., tens of) emitters. The emitters may have micro-lenses attached thereto for emitter collimation and beam shaping. Transform optics, normally confocal and positioned between the emitters and a dispersive element (e.g., a diffraction grating), collimate individual beams from different emitters and converge all the chief rays of the beams toward the center of the grating, particularly in the WBC dimension (i.e., the dimension, or direction, in which the beams are combined). The main beam diffracted by the dispersive element propagates to a partially reflective output coupler, which provides feedback to individual emitters and defines wavelengths of individual emitters via the dispersive element. That is, the coupler reflects a portion of the various beams back to their individual emitters, thereby forming external lasing cavities, and transmits the combined multi-wavelength beam for applications such as welding, cutting, machining, processing, etc. and/or for coupling into one or more optical fibers.

In embodiments of the present invention, a secondary beam diffracted by the dispersive element, which is normally discarded or otherwise unutilized, is utilized for power and/or spectral monitoring of the WBC system. Since the secondary beam is not tapped off of the main diffracted beam of the WBC system, no additional optics and associated power losses are introduced into the main beam. In addition, the secondary beam typically has a power level one or two orders of magnitude larger than that which would be workable or desirable when tapping a monitoring beam directly off of the main beam; thus, the secondary beam is much less sensitive to environmental changes (e.g., changes in temperature and/or humidity) within the WBC resonator. The secondary beam is highly directional and has concentrated power, and thus is less affected or significantly unaffected by other stray light within the resonator housing. Moreover, since the secondary beam is wavelength-stabilized (or "wavelength-locked"), it is substantially unaffected by wavelength-unlocked light—such unlocked light will have different wavelengths from those of locked beams and will thus diffract into different directions. The secondary beam is also typically unaffected by any back reflections from optics inside or outside of the WBC resonator and back reflections from optical fibers and/or workpieces.

Although diffraction gratings are utilized herein as exemplary dispersive elements, embodiments of the invention may utilize other dispersive elements such as, for example, dispersive prisms, transmission gratings, or Echelle gratings. Embodiments of the invention may utilize one or more prisms in addition to one or more diffraction gratings, for example as described in U.S. patent application Ser. No. 15/410,277, filed on Jan. 19, 2017, the entire disclosure of which is incorporated by reference herein.

Embodiments of the present invention couple multi-wavelength output beams into an optical fiber. In various embodiments, the optical fiber has multiple cladding layers surrounding a single core, multiple discrete core regions (or "cores") within a single cladding layer, or multiple cores surrounded by multiple cladding layers. In various embodiments, the output beams may be delivered to a workpiece for applications such as cutting, welding, etc.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, vertical cavity surface emitting lasers (VCSELs), etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams.

Laser diode arrays, bars and/or stacks, such as those described in the following general description may be used in association with embodiments of the innovations described herein. Laser diodes may be packaged individually or in groups, generally in one-dimensional rows/arrays (diode bars) or two dimensional arrays (diode-bar stacks). A diode array stack is generally a vertical stack of diode bars. Laser diode bars or arrays generally achieve substantially higher power, and cost effectiveness than an equivalent single broad area diode. High-power diode bars generally contain an array of broad-area emitters, generating tens of watts with relatively poor beam quality; despite the higher power, the brightness is often lower than that of a broad area laser diode. High-power diode bars may be stacked to produce high-power stacked diode bars for generation of extremely high powers of hundreds or thousands of watts. Laser diode arrays may be configured to emit a beam into free space or into a fiber. Fiber-coupled diode-laser arrays may be conveniently used as a pumping source for fiber lasers and fiber amplifiers.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 µm×100 µm. The beam quality along the 1 µm dimension or fast-axis is typically diffraction-limited. The beam quality along the 100 µm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

A diode stack is simply an arrangement of multiple diode bars that can deliver very high output power. Also called diode laser stack, multi-bar module, or two-dimensional laser array, the most common diode stack arrangement is that of a vertical stack which is effectively a two-dimensional array of edge emitters. Such a stack may be fabricated by attaching diode bars to thin heat sinks and stacking these assemblies so as to obtain a periodic array of diode bars and heat sinks. There are also horizontal diode stacks, and two-dimensional stacks. For the high beam quality, the diode bars generally should be as close to each other as possible. On the other hand, efficient cooling requires some minimum thickness of the heat sinks mounted between the bars. This tradeoff of diode bar spacing results in beam quality of a diode stack in the vertical direction (and subsequently its brightness) is much lower than that of a single diode bar. There are, however, several techniques for significantly mitigating this problem, e.g., by spatial interleaving of the outputs of different diode stacks, by polarization coupling, or by wavelength multiplexing. Various types of high-power beam shapers and related devices have been developed for such purposes. Diode stacks may provide extremely high output powers (e.g. hundreds or thousands of watts).

Output beams produced in accordance with embodiments of the present invention may be utilized to process a workpiece such that the surface of the workpiece is physically altered and/or such that a feature is formed on or within the surface, in contrast with optical techniques that merely probe a surface with light (e.g., reflectivity measurements). Exemplary processes in accordance with embodiments of the invention include cutting, welding, drilling, and soldering. Various embodiments of the invention may also process workpieces at one or more spots or along a one-dimensional linear or curvilinear processing path, rather than flooding all or substantially all of the workpiece surface with radiation from the laser beam. Such one-dimensional paths may be composed of multiple segments, each of which may be linear or curvilinear.

Embodiments of the invention may vary beam shape and/or BPP to improve or optimize performance for different types of processing techniques or different types of materials being processed. Embodiments of the invention may utilize various techniques for varying BPP and/or shape of laser beams described in U.S. patent application Ser. No. 14/632,283, filed on Feb. 26, 2015, U.S. patent application Ser. No. 14/747,073, filed Jun. 23, 2015, U.S. patent application Ser. No. 14/852,939, filed Sep. 14, 2015, U.S. patent application Ser. No. 15/188,076, filed Jun. 21, 2016, U.S. patent application Ser. No. 15/479,745, filed Apr. 5, 2017, and U.S. patent application Ser. No. 15/649,841, filed Jul. 14, 2017, the disclosure of each of which is incorporated in its entirety herein by reference.

In an aspect, embodiments of the invention feature a wavelength beam combining (WBC) laser system that includes, consists essentially of, or consists of a plurality of beam emitters each configured to emit a beam, transform optics for converging chief rays of the emitted beams toward a diffraction grating, a diffraction grating, a partially reflective output coupler, and a first detection apparatus. Each of the beams may have a different wavelength. The diffraction grating receives the beams and produces, via diffraction of the beams incident on the diffraction grating, a primary first-order diffracted beam and a secondary first-order diffracted beam. The output coupler is positioned to receive the primary first-order diffracted beam, transmit a first portion of the primary first-order diffracted beam as a multi-wavelength output beam, and reflect a second portion of the primary first-order diffracted beam back toward the plurality of beam emitters. The first detection apparatus is positioned to receive the secondary first-order diffracted beam and detects power and/or spectral information from the secondary first-order diffracted beam.

Embodiments of the invention may include one or more of the following in any of a variety of combinations. The laser system may include a controller configured to receive the power and/or spectral information from the first detection apparatus and control the plurality of beam emitters and/or the primary first-order diffracted beam based at least in part on the information. The controller may be configured to control power and/or current supplied to one or more of the beam emitters based at least in part on the power and/or spectral information received from the first detection apparatus. The controller may be configured to control a position and/or a tilt angle of (i) one or more of the beam emitters, (ii) the transform optics, (iii) the diffraction grating, and/or (iv) the output coupler based at least in part on the power and/or spectral information received from the first detection apparatus.

The diffraction grating may include, consist essentially of, or consist of a transmissive diffraction grating. The primary first-order diffracted beam may include, consist essentially of, or consist of a first-order transmission. The secondary first-order diffracted beam may include, consist essentially of, or consist of a first-order reflection. The diffraction grating may include, consist essentially of, or consist of a reflective diffraction grating. The primary first-order diffracted beam may include, consist essentially of, or consist of a first-order reflection. The secondary first-order diffracted beam may include, consist essentially of, or consist of a first-order transmission.

The diffraction grating may produce, via diffraction of the incident beams, a zeroth-order transmission and/or a zeroth-order reflection. The laser system may include a second detection apparatus for detecting power and/or spectral information from the zeroth-order transmission and/or the zeroth-order reflection. The controller may be configured to receive the power and/or spectral information from the second detection apparatus and control the plurality of beam emitters and/or the primary first-order diffracted beam based at least in part on the information. The controller may be configured to control power and/or current supplied to one or more of the beam emitters based at least in part on the power and/or spectral information received from the second detection apparatus. The controller may be configured to control a position and/or a tilt angle of (i) one or more of the beam emitters, (ii) the transform optics, (iii) the diffraction grating, and/or (iv) the output coupler based at least in part on the power and/or spectral information received from the second detection apparatus. The second detection apparatus may include, consist essentially of, or consist of a power detector. The power detector may include, consist essentially of, or consist of one or more photodiodes and/or one or more thermopiles. The second detection apparatus may include, consist essentially of, or consist of a spectrometer. The second detection apparatus may include, consist essentially of, or consist of a spectrometer and a power detector. The second detection apparatus may include a beam splitter for receiving the zeroth-order transmission and/or the zeroth-order reflection and supplying portions thereof to different outputs. The beam splitter may include, consist essentially of, or consist of a fiber coupler. A power detector may be coupled to a first output of the beam splitter and/or a spectrometer may be coupled to a second output of the beam splitter.

The diffraction grating may tilted in a WBC plane with respect to the incident beams at a non-Littrow angle. An angle between the incident beams and the diffraction grating in the WBC plane may be different from an angle between the secondary first-order diffracted beam and the diffraction grating in the WBC plane. The diffraction grating may be tilted in a WBC plane with respect to the incident beams at a Littrow angle. An angle between the incident beams and the diffraction grating in the WBC plane may be equal to an angle between the secondary first-order diffracted beam and the diffraction grating in the WBC plane. The diffraction grating may be tilted in a non-WBC plane with respect to the incident beams at a non-Littrow angle. An angle between the incident beams and the diffraction grating in a non-WBC plane may be different from an angle between the secondary first-order diffracted beam and the diffraction grating in the non-WBC plane.

The first detection apparatus may include, consist essentially of, or consist of a power detector. The power detector may include, consist essentially of, or consist of one or more photodiodes and/or one or more thermopiles. The first detection apparatus may include, consist essentially of, or consist of a spectrometer. The first detection apparatus may include, consist essentially of, or consist of a spectrometer and a power detector. The first detection apparatus may include a beam splitter for receiving the secondary first-order diffracted beam and supplying portions of the secondary first-order diffracted beam to different outputs. The beam splitter may include, consist essentially of, or consist of a fiber coupler. A power detector may be coupled to a first output of the beam splitter and/or a spectrometer may be coupled to a second output of the beam splitter.

In another aspect, embodiments of the invention feature a method of operating a wavelength beam combining (WBC) laser system. The WBC laser system may include, consist essentially of, or consist of (i) a plurality of beam emitters each configured to emit a beam, (ii) transform optics for converging chief rays of the emitted beams toward a diffraction grating, (iii) a diffraction grating for receiving the beams and producing, via diffraction of the beams incident on the diffraction grating, a primary first-order diffracted beam and a secondary first-order diffracted beam, and (iv) a partially reflective output coupler positioned to receive the primary first-order diffracted beam, transmit a first portion of the primary first-order diffracted beam as a multi-wavelength output beam, and reflect a second portion of the primary first-order diffracted beam back toward the plurality of beam emitters. Power and/or spectral information is detected from the secondary first-order diffracted beam, and (at least one of) the plurality of beam emitters and/or the primary first-order diffracted beam is controlled based at least in part on the information.

Embodiments of the invention may include one or more of the following in any of a variety of combinations. Controlling the plurality of beam emitters and/or the primary first-order diffracted beam may include, consist essentially of, or consist of controlling power and/or current supplied to one or more of the beam emitters based at least in part on the power and/or spectral information. Controlling the plurality of beam emitters and/or the primary first-order diffracted beam may include, consist essentially of, or consist of controlling a position and/or a tilt angle of (i) one or more of the beam emitters, (ii) the transform optics, (iii) the diffraction grating, and/or (iv) the output coupler based at least in part on the power and/or spectral information.

The diffraction grating may include, consist essentially of, or consist of a transmissive diffraction grating. The primary first-order diffracted beam may include, consist essentially of, or consist of a first-order transmission. The secondary first-order diffracted beam may include, consist essentially of, or consist of a first-order reflection. The diffraction grating may include, consist essentially of, or consist of a reflective diffraction grating. The primary first-order diffracted beam may include, consist essentially of, or consist of a first-order reflection. The secondary first-order diffracted beam may include, consist essentially of, or consist of a first-order transmission.

The diffraction grating may produce, via diffraction of the incident beams, a zeroth-order transmission and/or a zeroth-order reflection. Power and/or spectral information may be detected from the zeroth-order transmission and/or the zeroth-order reflection. The plurality of beam emitters and/or the primary first-order diffracted beam may be controlled based at least in part on the power and/or spectral information from the zeroth-order transmission and/or the zeroth-order reflection. Controlling the plurality of beam emitters and/or the primary first-order diffracted beam may include, consist essentially of, or consist of controlling power and/or current supplied to one or more of the beam emitters based at least in part on the power and/or spectral information from the zeroth-order transmission and/or the zeroth-order reflection. Controlling the plurality of beam emitters and/or the primary first-order diffracted beam may include, consist essentially of, or consist of controlling a position and/or a tilt angle of (i) one or more of the beam emitters, (ii) the transform optics, (iii) the diffraction grating, and/or (iv) the output coupler based at least in part on the power and/or spectral information from the zeroth-order transmission and/or the zeroth-order reflection.

The diffraction grating may tilted in a WBC plane with respect to the incident beams at a non-Littrow angle. An angle between the incident beams and the diffraction grating in the WBC plane may be different from an angle between the secondary first-order diffracted beam and the diffraction grating in the WBC plane. The diffraction grating may be tilted in a WBC plane with respect to the incident beams at a Littrow angle. An angle between the incident beams and the diffraction grating in the WBC plane may be equal to an angle between the secondary first-order diffracted beam and the diffraction grating in the WBC plane. The diffraction grating may be tilted in a non-WBC plane with respect to the incident beams at a non-Littrow angle. An angle between the incident beams and the diffraction grating in a non-WBC plane may be different from an angle between the secondary first-order diffracted beam and the diffraction grating in the non-WBC plane.

In yet another aspect, embodiments of the invention feature a method of operating a laser resonator. A plurality of beams is emitted from a plurality of beam emitters. Each of the beam emitters may emit a beam having a different wavelength. The plurality of beams is diffracted (or otherwise wavelength-dispersed) to form a primary beam and one or more secondary beams. A first portion of the primary beam is propagated back to the plurality of beam emitters. A second portion of the primary beam is outputted from the laser resonator. The second portion of the primary beam may be a multi-wavelength beam. Power and/or spectral information is detected from at least one said secondary beam. The plurality of beam emitters and/or the primary beam is controlled based at least in part on the power and/or spectral information from the at least one said secondary beam.

Embodiments of the invention may include one or more of the following in any of a variety of combinations. The primary beam may include, consist essentially of, or consist of a first-order diffracted transmission. The one or more secondary beams may include, consist essentially of, or consist of (i) a first-order diffracted reflection, (ii) a zeroth-order diffracted transmission, and/or (iii) a zeroth-order diffracted reflection. The primary beam may include, consist essentially of, or consist of a first-order diffracted reflection. The one or more secondary beams may include, consist essentially of, or consist of (i) a first-order diffracted transmission, (ii) a zeroth-order diffracted transmission, and/or (iii) a zeroth-order diffracted reflection. Controlling the plurality of beam emitters and/or the primary beam may include, consist essentially of, or consist of controlling power and/or current supplied to one or more of the beam emitters based at least in part on the power and/or spectral information from the at least one said secondary beam. The plurality of beams may be diffracted by a diffraction grating or other dispersive element. The diffraction grating may be tilted in a WBC plane with respect to the incident beams at a non-Littrow angle. The diffraction grating may be tilted in a WBC plane with respect to the incident beams at a Littrow angle. The diffraction grating may be tilted in a non-WBC plane with respect to the incident beams at a non-Littrow angle.

In another aspect, embodiments of the invention feature a method of operating a wavelength beam combining (WBC) laser system. The WBC laser system may include, consist essentially of, or consist of (i) a plurality of beam emitters each configured to emit a beam, (ii) transform optics for converging chief rays of the emitted beams toward a diffraction grating, (iii) a diffraction grating for receiving the beams and producing, via diffraction of the beams incident on the diffraction grating, a first-order diffracted beam and at least one zeroth-order diffracted beam, and (iv) a partially reflective output coupler positioned to receive the first-order diffracted beam, transmit a first portion of the first-order diffracted beam as a multi-wavelength output beam, and reflect a second portion of the first-order diffracted beam back toward the plurality of beam emitters. Power and/or spectral information is detected from the at least one zeroth-order diffracted beam, and the plurality of beam emitters and/or the first-order diffracted beam is controlled based at least in part on the information.

Embodiments of the invention may include one or more of the following in any of a variety of combinations. The first-order diffracted beam may include, consist essentially of, or consist of a first-order diffracted transmission. The first-order diffracted beam may include, consist essentially of, or consist of a first-order diffracted reflection. The at least one zeroth-order diffracted beam may include, consist essentially of, or consist of a zeroth-order diffracted transmission and/or a zeroth-order diffracted reflection. Controlling the plurality of beam emitters and/or the first-order diffracted beam may include, consist essentially of, or consist of controlling power and/or current supplied to one or more of the beam emitters based at least in part on the power and/or spectral information. Controlling the plurality of beam emitters and/or the first-order diffracted beam may include, consist essentially of, or consist of controlling a position and/or a tilt angle of (i) one or more of the beam emitters, (ii) the transform optics, (iii) the diffraction grating, and/or (iv) the output coupler based at least in part on the power and/or spectral information. The diffraction grating may be tilted in a WBC plane with respect to the incident beams at a non-Littrow angle. The diffraction grating may be tilted in a WBC plane with respect to the incident beams at a Littrow angle. The diffraction grating may be tilted in a non-WBC plane with respect to the incident beams at a non-Littrow angle.

In yet another aspect, embodiments of the invention feature a wavelength beam combining (WBC) laser system that includes, consists essentially of, or consists of a plurality of beam emitters each configured to emit a beam, transform optics for converging chief rays of the emitted beams toward a diffraction grating, a diffraction grating, a partially reflective output coupler, and a detection apparatus. Each of the beams may have a different wavelength. The diffraction grating receives the beams and produces, via diffraction of the beams incident on the diffraction grating, a first-order diffracted beam and at least one zeroth-order diffracted beam. The output coupler is positioned to receive the first-order diffracted beam, transmit a first portion of the first-order diffracted beam as a multi-wavelength output beam, and reflect a second portion of the first-order diffracted beam back toward the plurality of beam emitters. The detection apparatus detects power and/or spectral information from at least one said zeroth-order diffracted beam. The detection apparatus may be positioned to receive at least one said zeroth-order diffracted beam.

Embodiments of the invention may include one or more of the following in any of a variety of combinations. The laser system may include a controller configured to receive the power and/or spectral information from the detection apparatus and control the plurality of beam emitters and/or the first-order diffracted beam based at least in part on the information. The controller may be configured to control power and/or current supplied to one or more of the beam emitters based at least in part on the power and/or spectral information received from the detection apparatus. The controller may be configured to control a position and/or a tilt angle of (i) one or more of the beam emitters, (ii) the transform optics, (iii) the diffraction grating, and/or (iv) the output coupler based at least in part on the power and/or spectral information received from the detection apparatus.

The first-order diffracted beam may include, consist essentially of, or consist of a first-order transmission. The first-order diffracted beam may include, consist essentially of, or consist of a first-order reflection. The at least one zeroth-order diffracted beam may include, consist essentially of, or consist of a zeroth-order transmission and/or a zeroth-order reflection. The diffraction grating may be tilted in a WBC plane with respect to the incident beams at a non-Littrow angle. The diffraction grating may be tilted in a WBC plane with respect to the incident beams at a Littrow angle. The diffraction grating may be tilted in a non-WBC plane with respect to the incident beams at a non-Littrow angle.

The detection apparatus may include, consist essentially of, or consist of a power detector. The power detector may include, consist essentially of, or consist of one or more photodiodes and/or one or more thermopiles. The detection apparatus may include, consist essentially of, or consist of a spectrometer. The detection apparatus may include, consist essentially of, or consist of a spectrometer and a power detector. The detection apparatus may include a beam splitter for receiving at least one said zeroth-order diffracted beam and supplying portions thereof to different outputs. The beam splitter may include, consist essentially of, or consist of a fiber coupler. A power detector may be coupled to a first output of the beam splitter and/or a spectrometer may be coupled to a second output of the beam splitter.

In another aspect, embodiments of the invention feature a method of processing a workpiece using a laser resonator. A wavelength-locked primary beam is formed at least in part by diffraction within the laser resonator. At least a portion of the primary beam is directed onto a workpiece to process the workpiece. Before and/or during processing, wavelength-locked light is monitored within the laser resonator to detect power and/or spectral information therefrom. Before and/or during processing, the primary beam is controlled based at least in part on the detected power and/or spectral information.

Embodiments of the invention may include one or more of the following in any of a variety of combinations. Wavelength-locked light within the resonator may be monitored without extracting a portion of the primary beam. Wavelength-locked light within the resonator may be monitored without measuring the primary beam. One or more wavelength-locked secondary beams may be formed, at least in part by diffraction, simultaneously with the formation of the primary beam. One or more of the secondary beams may be diffracted in a different direction than the primary beam. Monitoring wavelength-locked light within the laser resonator may include, consist essentially of, or consist of monitoring at least one said secondary beam. The one or more secondary beams may include, consist essentially of, or consist of a first-order diffracted transmission or a first-order diffracted reflection. The one or more secondary beams may include, consist essentially of, or consist of a zeroth-order diffracted transmission and/or a zeroth-order diffracted reflection. Controlling the primary beam may include, consist essentially of, or consist of controlling power of the primary beam or a portion thereof.

Forming the primary beam may include, consist essentially of, or consist of, within the laser resonator, emitting a plurality of beams from a plurality of beam emitters, focusing the plurality of beams toward a diffraction grating, and diffracting the beams with the diffraction grating to form the primary beam. The diffraction grating may be tilted in a wavelength beam combining (WBC) plane with respect to the incident beams at a non-Littrow angle. The diffraction grating may be tilted in a wavelength beam combining (WBC) plane with respect to the incident beams at a Littrow angle. The diffraction grating may be tilted in a non-WBC plane with respect to the incident beams at a non-Littrow angle.

During processing, the primary beam may be controlled based at least in part on at least one characteristic of the workpiece. The at least one characteristic of the workpiece may include, consist essentially of, or consist of a thickness of the workpiece and/or a composition of the workpiece. Processing the workpiece may include, consist essentially of, or consist of physically altering at least a portion of a surface of the workpiece. Processing the workpiece may include, consist essentially of, or consist of cutting, welding, etching, annealing, drilling, soldering, and/or brazing.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means ±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other. "Distances" utilized herein may be considered to be "optical distances" unless otherwise specified.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 5A is a schematic of a WBC laser system with integrated monitoring capability, viewed in the WBC plane, in accordance with embodiments of the invention; and FIG. 5B is a schematic of the WBC laser system of FIG. 5A, viewed in a non-WBC plane, in accordance with embodiments of the invention.

DETAILED DESCRIPTION

Figure 1:
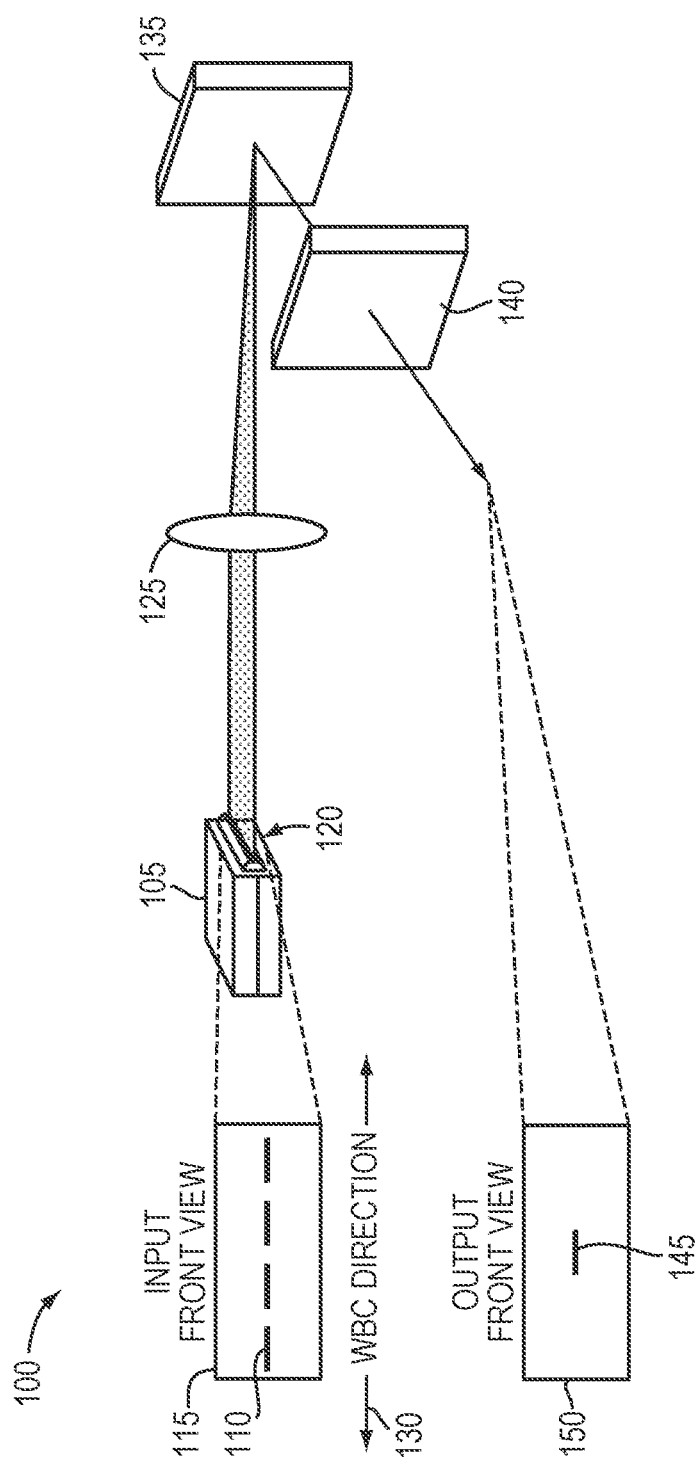
FIG. 1 is a schematic diagram of a wavelength beam combining (WBC) laser system in accordance with embodiments of the invention.

FIG. 1 depicts an exemplary WBC laser system 100 that utilizes one or more lasers (or "emitters" or "beam emitters") 105. FIG. 1 is presented to illustrate the basic mechanisms of WBC, and laser systems in accordance with embodiments of the present invention may include additional elements (e.g., additional optical elements, cross-talk mitigation systems, etc.). In the example of FIG. 1, laser 105 features a diode bar having four beam emitters emitting beams 110 (see magnified input view 115), but embodiments of the invention may utilize diode bars emitting any number of individual beams or two-dimensional arrays or stacks of diodes or diode bars. In view 115, each beam 110 is indicated by a line, where the length or longer dimension of the line represents the slow diverging dimension of the beam, and the height or shorter dimension represents the fast diverging dimension. A collimation optic 120 may be used to collimate each beam 110 along the fast dimension. Transform (or "focusing") optic(s) 125, which may include, consist essentially of, or consist of, for example, one or more cylindrical or spherical lenses and/or mirrors, are used to combine each beam 110 along a WBC direction 130. The transform optics 125 then at least partially (and, typically, substantially) overlap the combined beam onto a dispersive element 135 (which may include, consist essentially of, or consist of, e.g., a reflective or transmissive diffraction grating, a dispersive prism, a grism (prism/grating), a transmission grating, or an Echelle grating), and the combined beam is then transmitted as single output profile onto an output coupler 140. The output coupler 140 then transmits the combined beams 145 as shown on the output front view 150. The output coupler 140 is typically partially reflective and acts as a common front facet for all the laser elements in this external cavity system 100. An external cavity is a lasing system where the secondary mirror is displaced at a distance away from the emission aperture or facet of each laser emitter. In some embodiments, additional optics are placed between the emission aperture or facet and the output coupler or partially reflective surface. The output beam 145 is a thus a multiple-wavelength beam (combining the wavelengths of the individual beams 110), and may be utilized as the input beam in a laser beam delivery systems, may be utilized to process a workpiece, and/or may be coupled into an optical fiber.

Figure 2:
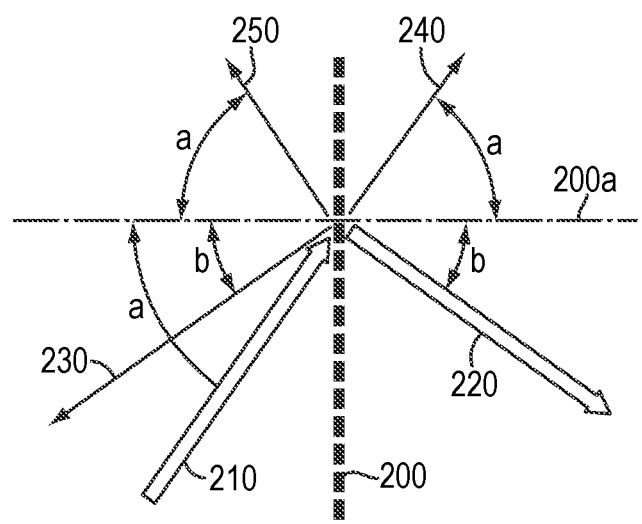
FIG. 2 is a schematic of diffracted beams resulting from diffraction at a diffraction beam in accordance with embodiments of the invention.

FIG. 2 depicts diffraction, by an exemplary diffraction grating 200, of an incoming laser beam 210. The normal 200a to the plane of diffraction grating 200 is depicted as a dot-dashed line in FIG. 2. Diffraction at the grating 200 obeys the following Equation 1:

$$\sin a + \sin b = m p l$$

where m is the diffraction order (0, ±1, ±2, . . . ), p is the grating pitch (i.e., the number of lines or grooves per unit length), l is the wavelength, and the angles a and b have the same sign (positive or negative) when at the same side of the grating normal 200a.

FIG. 2 depicts a first-order diffracted transmission 220, a first-order diffracted reflection 230, a zeroth-order transmission 240, and a zeroth-order reflection 250. The first-order transmission 220 and reflection 230 obey Equation 1 with m=1 or −1, and the zeroth-order transmission 240 and reflection 250 obey Equation 1 with m=0. For the first-order diffraction, the diffraction efficiency is typically optimized at the Littrow configuration, i.e., when the angle of incidence a is equal to the first-order diffraction angle b.

High-power WBC systems typically require high-efficiency diffraction, i.e., typically utilize either the transmission 220 or the reflection 230. If a WBC system utilizes a transmissive diffraction grating, the first-order transmission 220 is typically utilized as the resonator beam, and the first-order reflection 230 will exit the resonator and is typically discarded (e.g., directed to a beam dump and/or away from the resonator). If the WBC system utilizes a reflective diffraction grating, the first-order reflection 230 typically has the highest efficiency and is utilized as the resonator beam, while the first-order transmission 220 is discarded. (Thus, as utilized herein, "transmissive" diffraction gratings are capable of transmitting, and typically do transmit, a primary diffracted beam but also reflect one or more secondary, lower-power diffracted beams. In addition, as utilized herein, "reflective" diffraction gratings are capable of reflecting, and typically do reflect, a primary diffracted beam but also transmit one or more secondary, lower-power diffracted beams. Thus, diffraction gratings are designated as "transmissive" or "reflective" based on the formation mechanism for the primary, higher-power diffracted beam, and "transmissive" does not connote the inability to reflect and vice versa.) In various implementations, since reflective gratings may feature reflective metallic coatings and may have ground back surfaces, the first-order transmission 220 and/or the zeroth-order transmission 240 may be difficult to observe.

Diffraction gratings utilized in WBC systems typically have diffraction efficiencies larger than 90%. The remaining 10% or less becomes power loss and is mainly distributed among the zeroth-order transmission 240, the zeroth-order reflection 250, and the less-efficient (or "secondary") first-order diffraction (related to either the transmission 220 or the reflection 230). Embodiments of the present invention utilize the secondary first-order diffraction for power and/or spectral monitoring within the WBC resonator. The secondary first-order diffraction is wavelength-combined, like the primary first-order diffraction beam, and thus perfectly indicates power fluctuations and the dynamics of spectral composition of the WBC resonator output.

Figure 3:
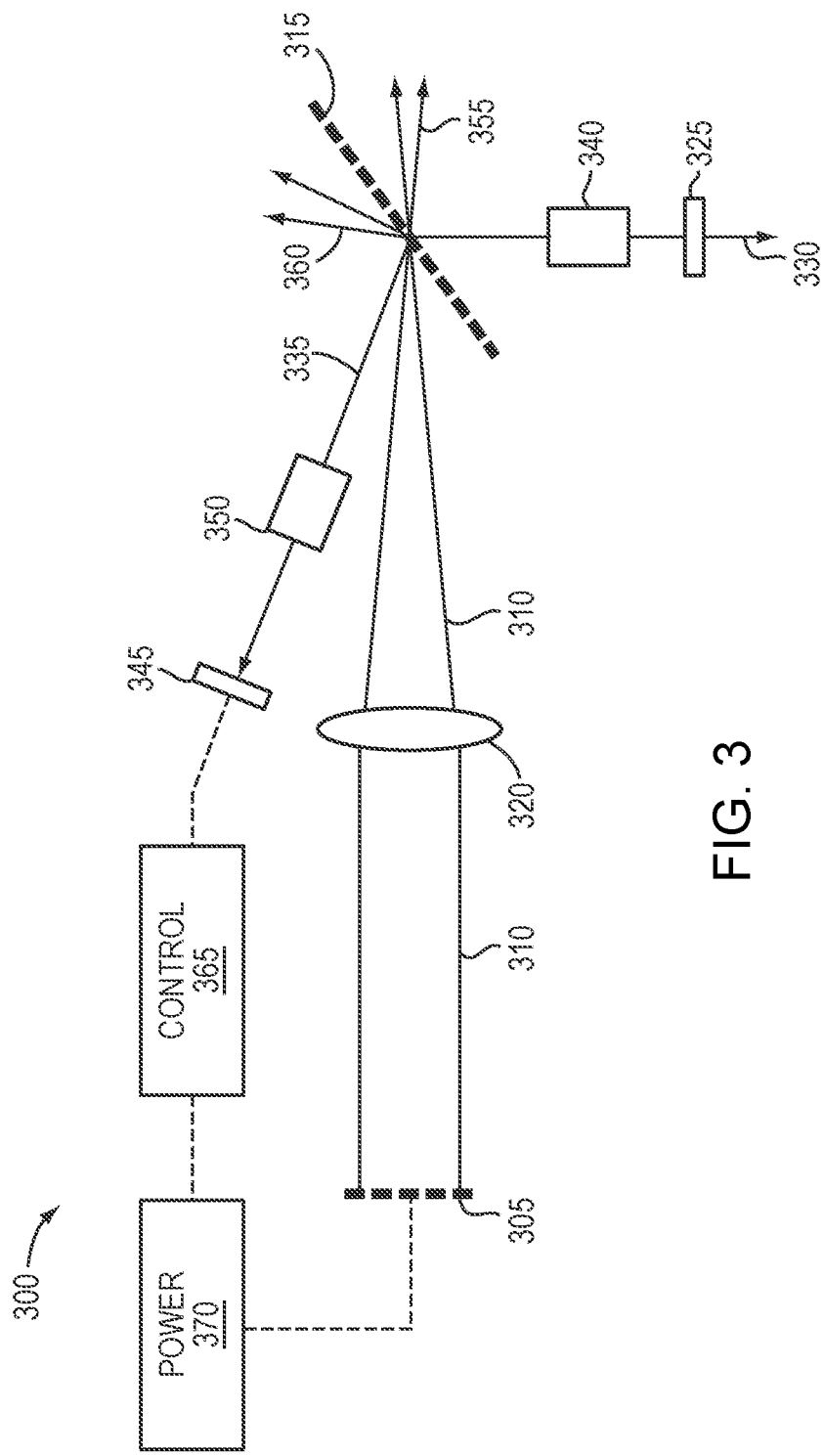
FIG. 3 is a schematic of a WBC laser system with integrated monitoring capability in accordance with embodiments of the invention.

FIG. 3 depicts a WBC resonator 300 in accordance with various embodiments of the invention. In the WBC resonator 300, multiple emitters 305 emit laser beams represented in FIG. 3 by chief rays 310. Although FIG. 3 depicts the use of four emitters 305, embodiments of the invention feature two, three, or more than four emitters 305. The chief rays 310 are overlapped at or proximate a diffraction grating 315 (or other dispersive element) by transform optics 320. In various embodiments of the invention, transform optics 320 include, consist essentially of, or consist of one or more cylindrical and/or spherical lenses and/or one or more other optical elements. A partially reflective output coupler 325 provides feedback to the emitters 305 of the WBC resonator 300 to lock the emitter wavelengths (which are each typically unique, i.e., different from each other) so that all of the first-order diffractions are combined into a first-order transmission beam 330 and a first-order reflection beam 335. In the exemplary embodiment illustrated in FIG. 3, grating 315 is a transmissive diffraction grating, and thus the output coupler 325 is positioned on the transmission side (i.e., the side opposite the emitters 305) to receive the first-order transmission beam 330 from the grating 315. Thus, in the illustrated embodiment, the first-order reflection 335 is the secondary beam used for power and/or spectral monitoring.

In various embodiments of the invention, the WBC resonator may include an optical system 340 located downstream of the grating 315 (e.g., between the grating 315 and the output coupler 325) for beam resizing and/or mitigation of cross-coupling. For example, the optical system 340 may include, consist essentially of, or consist of one or more lenses and/or any of the components utilized for cross-coupling mitigation and described in U.S. patent application Ser. No. 14/964,700, filed on Dec. 10, 2015, the entire disclosure of which is incorporated by reference herein.

As shown, the WBC resonator 300 also includes a power detector 345 that receives all or a portion of the first-order reflection 335 and is utilized to monitor WBC power fluctuations based thereon. The power detector 345 may include, consist essentially of, or consist of, for example, one or more photodiodes and/or one or more thermopiles. In various embodiments of the invention, the WBC resonator 300 also includes an optical system 350 in the optical path from the grating 315 to the detector 345. The optical system 350 may include optics for beam redirection, imaging, focusing, and/or power attenuation, and/or components (e.g., one or more slits) for blocking stray light or other beams such as the zeroth-order transmission beam 355 and the zeroth-order reflection beam 360 from reaching the detector 345.

In various embodiments, the detector 345 is coupled to a control system (or "controller") 365 that controls one or more components and/or functions of the WBC resonator 300 based on the detected power. For example, the controller 365 may automatically shut off power supplied to the system (e.g., to the emitters 305) in the event of a fluctuation or diminishment of the power level detected by detector 345. In other embodiments, the controller 365 may block propagation of the combined multi-wavelength beam 330 transmitted by the output coupler 325 (e.g., to an optical fiber or to a workpiece to be processed) in the event of power fluctuations, e.g., during initial stages of operation of the WBC resonator 300, where power fluctuations may occur as various components heat up. For example, the controller 365 may be configured to block the propagation of beam 330 via operation of a shutter, a mirror, or other occlusion or redirection mechanism that prevents the beam 330 from exiting the resonator 300 from its beam exit. In various embodiments, the controller 365 may be configured to block propagation of beam 330 and/or shut off power to system 300 in the event of power fluctuations that exceed ±20% of a typical or desired output power level, ±10% of the typical or desired output power level, or ±5% of the typical or desired output power level.

In various embodiments, the controller 365 may adjust the diffraction grating 315 (e.g., a tilt angle of the grating) and/or the transform optics 320 (e.g., a position and/or angle of one or more lenses or mirrors) in response to the detected power level. For example, the WBC resonator 300 may include one or more positioning systems that are responsive to commands from the controller 365 and that control the position (e.g., tilt angle, location, etc.) of components such as the grating 315 and the transform optics 320. In various embodiments, the positioning system may include, consist essentially of, or consist of, e.g., tip/tilt mounts with one or more actuators.

In various embodiments, the controller 365 utilizes the monitored power level as feedback to stabilize the WBC output beam via control of the power or current supplied to the emitters 305, for example, via control of a power supply 370 supplying power to the emitters 305. That is, the controller 365 may increase the power or current supplied to the emitters 305 if the sensed output power decreases and vice versa. In various embodiments, the controller 365 may monitor the output power and, in the event of the output power gradually diminishing, the controller 365 may utilize the sensed output power as feedback to predict the operational lifetime of the system. For example, the controller 365 may forecast when the decreasing output power of the system (or, similarly, the increasing power supplied to the emitters 305 to counteract the decreased output power) will reach a level outside of the specified operating power range for the system (e.g., exceed or fall below a predetermined threshold power level) and predict the lifetime of the system 300 based on the power forecast and the service time of the system (e.g., based on one or more of total usage time, usage patterns, etc.).

The controller 365 may be provided as either software, hardware, or some combination thereof. For example, the system may be implemented on one or more conventional server-class computers, such as a PC having a CPU board containing one or more processors such as the Pentium or Celeron family of processors manufactured by Intel Corporation of Santa Clara, Calif., the 680x0 and POWER PC family of processors manufactured by Motorola Corporation of Schaumburg, Ill., and/or the ATHLON line of processors manufactured by Advanced Micro Devices, Inc., of Sunnyvale, Calif. The processor may also include a main memory unit for storing programs and/or data relating to the methods described herein. The memory may include random access memory (RAM), read only memory (ROM), and/or FLASH memory residing on commonly available hardware such as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the programs may be provided using external RAM and/or ROM such as optical disks, magnetic disks, as well as other commonly used storage devices. For embodiments in which the functions are provided as one or more software programs, the programs may be written in any of a number of high level languages such as PYTHON, FORTRAN, PASCAL, JAVA, C, C++, C#, BASIC, various scripting languages, and/or HTML. Additionally, the software may be implemented in an assembly language directed to the microprocessor resident on a target computer; for example, the software may be implemented in Intel 80×86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM.

Figure 4:
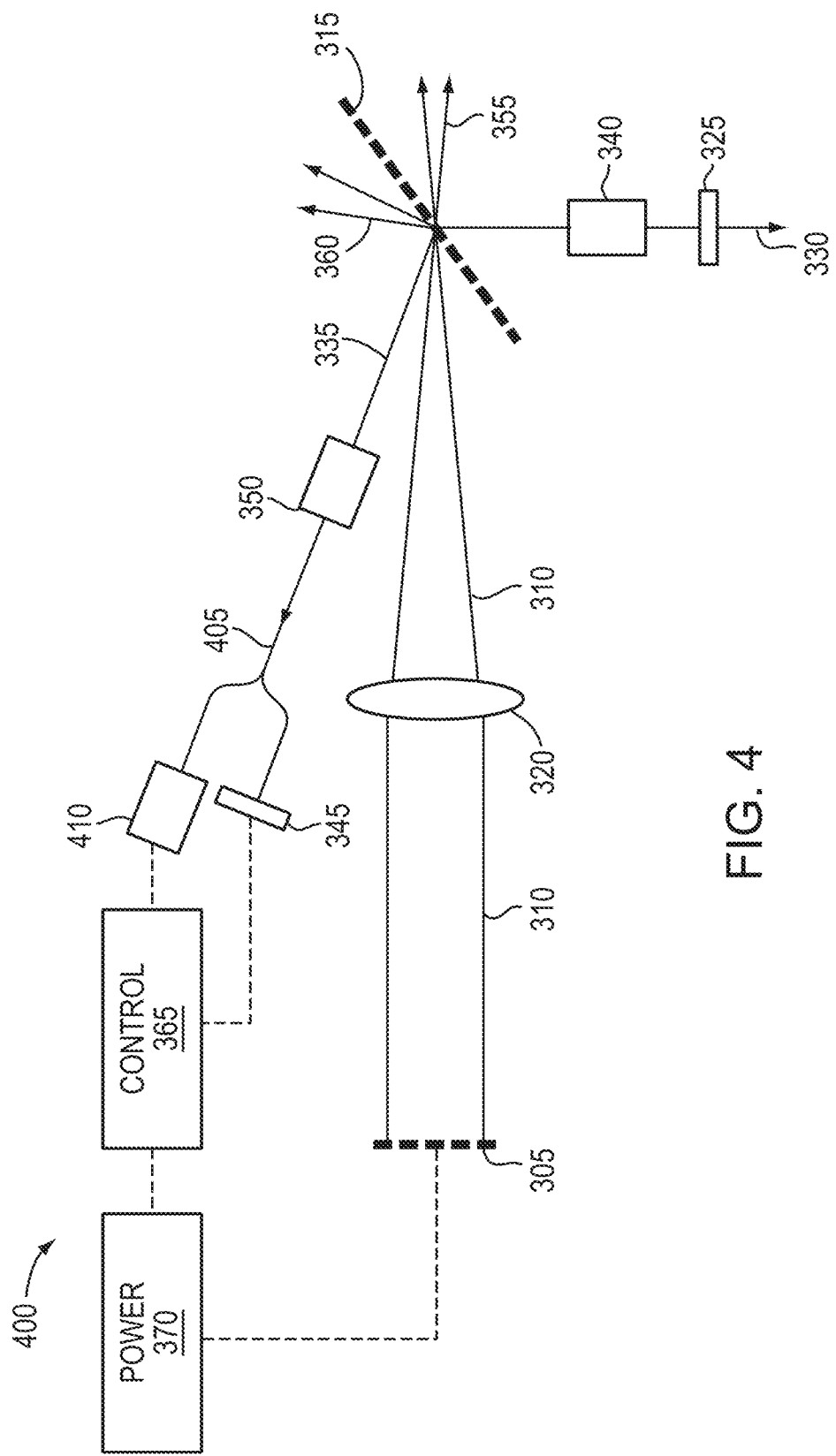
FIG. 4 is a schematic of a WBC laser system with integrated monitoring capability in accordance with embodiments of the invention.

In various embodiments of the invention, spectral information from the secondary diffracted beam in the WBC resonator may be monitored in addition to or instead of power. FIG. 4 depicts a WBC resonator 400 in which the secondary diffracted beam, corresponding in the illustrated embodiment to the first-order reflection 335, is utilized to monitor both power and spectral information of the main diffracted beam (i.e., first-order transmission 330). In FIG. 4, the secondary beam 335 propagates to a fiber coupler 405 (illustrated as a 1×2 fiber coupler), or other beam-splitter, which divides the beam such that a portion of the beam is received by the power detector 345, and a second portion of the beam is received by a spectrometer 410. As in resonator 300 of FIG. 3, the controller 365 may be coupled to the power detector 345, and the controller 365 may also be coupled to the spectrometer 410, such that the detected power and spectral information may be utilized by the controller as input to control various functionality and/or components of the WBC resonator 400. Since the emitters 305 for the resonator each may emit at a different wavelength, the spectral information from the spectrometer 410 may be utilized to monitor and/or control individual emitters 305. For example, if a particular portion of the spectrum detected by the spectrometer 410 exhibits a power level that is too high or too low, the controller 365 may utilize the spectral information to modulate the operating power of an individual emitter 305 or group of emitters. In various embodiments of the invention, the monitored spectral information may be utilized to differentiate power fluctuations or drops due to overall degradations of the system 400 from failures of particular emitters 305 or emitter groups. For example, if failure or performance diminishment is detected of particular emitters 305, the controller 365 may alert the operator and/or shut down power to the system so that the particular emitters may be replaced.

The exemplary embodiments shown in FIGS. 3 and 4 also illustrate the zeroth-order transmission beam 355 and zeroth-order reflected beam 360 produced by the diffraction at the grating 315. In various embodiments, these beams may not be ideal for WBC power and spectral monitoring, because they are independent of the WBC resonator. That is, alterations of power within these beams may not be directly correlated with fluctuations of the main WBC beam and the WBC output power. However, in various embodiments, one or more of the zeroth-order beams 355, 360 are used to monitor emitter power (i.e., emitter power incident on the grating 315), which is not affected by the WBC resonator. For example, resonator misalignment (e.g., misalignment, blockage, or even removal of the output coupler 325) will typically decrease WBC output power and thus the signal detected by power detector 345, but such misalignment will typically not reduce the power level of the zeroth-order beams. Therefore, in various embodiments, one or more of the zeroth-order beams 355, 360 (i.e., reflection and/or transmission) may also be monitored (e.g., via a dedicated power detector and/or spectrometer) for a more complete picture of power variations and the possible causes. For example, differences in power and/or spectral information detected via monitoring of the zeroth-order beams may be used in combination with such differences detected using the secondary first-order beam in order to diagnose the root cause(s) of the fluctuations. In an example embodiment, the controller 365 may modulate the power supplied to (and thus output from) one or more of the emitters 305 based on a signal (e.g., power and/or spectral information) received from one or more of the zeroth-order beams 355, 360, and the controller 365 may also adjust the position (e.g., location and/or tilt) of one or more other components (e.g., the grating 315, transform optics 320, coupler 325, etc.) based on a signal (e.g., power and/or spectral information) received from the secondary beam 335.

The example WBC resonators 300, 400 depicted in FIGS. 3 and 4 utilize the diffraction grating 315 configured at an angle not corresponding to the Littrow configuration discussed above in relation to FIG. 2. That is, the angle of incidence with respect to the grating (i.e., angle a in FIG. 2) is not equal to the first-order diffraction angle (i.e., angle b in FIG. 2) in order to spatially separate the secondary first-order reflected beam 335 from the incident beam 310. While this off-Littrow configuration facilitates the capture of the secondary diffracted beam without interference with or from the incident beam, the off-Littrow configuration may result in lower grating efficiency and thus lower output power of the WBC resonator.

Embodiments of the invention address this potential inefficiency by tilting the diffraction grating away from the Littrow configuration in the non-WBC direction (or "dimension") while maintaining the grating in the Littrow configuration within the WBC plane. This embodiment of the invention is depicted in FIGS. 5A and 5B, in which the secondary beam (first-order reflection 335) is spatially separated from the incident beam 310 in the non-WBC direction (but not in the WBC direction), facilitating the monitoring of the secondary beam by the power detector 345 (and/or the spectrometer 410, not shown in FIGS. 5A and 5B).

As shown in the top view of resonator 500 in FIG. 5A, the diffraction grating 510 is configured at the Littrow angle in the WBC plane. Therefore, the first-order reflection 335, i.e., the secondary beam utilized for monitoring, propagates back toward the beam source (i.e., the emitters 305) when viewed in the WBC plane. As shown in the side view of FIG. 5B, the grating 510 is tilted by an angle d in the non-WBC plane, which introduces a "walk-off angle" equal to 2d for the first-order reflection 335 relative to the incident beam 310, thereby enabling the first-order reflection 335 to be more easily propagated to the power detector 345 (and/or spectrometer 410, not shown in FIGS. 5A and 5B). In various embodiments, the grating angle d in the non-WBC plane is relatively small in order to minimize or substantially eliminate possible deleterious side effects such as aberration and/or beam twist. For example, in various embodiments the angle d is less than 5°, less than 3°, less than 2°, or even less than 1°. In various embodiments, the angle d may be at least 0.001°, at least 0.005°, at least 0.01°, at least 0.05°, at least 0.1°, or even at least 0.5°. In typical embodiments, the angled grating as depicted in FIGS. 5A and 5B has little or no effect on the power and direction of the zeroth-order beams 355, 360.

As utilized herein, the "WBC plane" corresponds to the plane in which input beams are spectrally combined in a WBC resonator in accordance with embodiments of the present invention. In addition, a "non-WBC plane" is a plane different from the WBC plane, e.g., a plane substantially perpendicular to the WBC plane.

In various embodiments of the invention, the layout depicted in FIGS. 5A and 5B may be utilized for a WBC resonator incorporating a reflective diffraction grating. In such embodiments, the positions of the output coupler 325 and optical system 340 are exchanged with those of the power detector 345 and optical system 350, respectively, because the first-order reflection 335 is utilized as the main output beam of the WBC resonator, while the first-order transmission 330 is utilized for power and/or spectral monitoring.

Laser systems in accordance with embodiments of the present invention may utilize the primary diffracted beam 335 for processing of a workpiece and/or may couple the primary beam 335 into an optical fiber. The controller 365 may, in accordance with the embodiments of the invention, control the power and/or spectrum of the beam 335 based on information received from detector 345 and/or spectrometer 410 (as detailed above), and also based on the type of desired processing (e.g., cutting, welding, etc.) and/or on one or more characteristics (e.g., materials parameters, thickness, material type, etc.) of the workpiece to be processed (or being processed) and/or of a desired processing path mapped out for the output beam 335. Such process and/or material parameters may be selected by a user from a stored database in a memory associated with controller 365 or may be entered via an input device (e.g., touchscreen, keyboard, pointing device such as a computer mouse, etc.). One or more processing paths may be provided by a user and stored in an onboard or remote memory associated with controller 365. After workpiece and/or processing path selection, the controller 365 queries the database to obtain the corresponding parameter values. The stored values may include an output power or output-beam spectrum suitable to the material and/or to one or more processing paths or processing locations on the material.

The controller 365 may, in some embodiments, receive feedback regarding the position and/or processing efficacy of the beam relative to the workpiece from a feedback unit connected to suitable monitoring sensors. In response to signals from the feedback unit, the controller 365 may alter the power and/or spectrum of the beam as detailed herein. Embodiments of the invention may also incorporate aspects of the apparatus and techniques disclosed in U.S. patent application Ser. No. 14/639,401, filed on Mar. 5, 2015, U.S. patent application Ser. No. 15/261,096, filed on Sep. 9, 2016, and U.S. patent application Ser. No. 15/649,841, filed on Jul. 14, 2017, the entire disclosure of each of which is incorporated by reference herein.

In addition, the laser systems in accordance with embodiments of the invention may incorporate one or more systems for detecting the thickness of the workpiece and/or heights of features thereon. For example, the laser system may incorporate systems (or components thereof) for interferometric depth measurement of the workpiece, as detailed in U.S. patent application Ser. No. 14/676,070, filed on Apr. 1, 2015, the entire disclosure of which is incorporated by reference herein. Such depth or thickness information may be utilized by the controller to control the beam power and/or spectrum to optimize the processing (e.g., cutting or welding) of the workpiece, e.g., in accordance with records in the database corresponding to the type of material being processed.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A wavelength beam combining (WBC) laser system comprising:
   a plurality of beam emitters, each beam emitter configured to emit a beam having a different wavelength;
   transform optics for converging chief rays of the emitted beams toward a diffraction grating;
   a diffraction grating for receiving the beams and producing, via diffraction of the beams incident on the diffraction grating, a primary first-order diffracted beam and a secondary first-order diffracted beam;

a partially reflective output coupler positioned to receive the primary first-order diffracted beam, transmit a first portion of the primary first-order diffracted beam as a multi-wavelength output beam, and reflect a second portion of the primary first-order diffracted beam back toward the plurality of beam emitters; and positioned to receive the secondary first-order diffracted beam, a first detection apparatus for detecting power and/or spectral information from the secondary first-order diffracted beam.

2. The laser system of claim 1, further comprising a controller configured to receive the power and/or spectral information from the first detection apparatus and control the plurality of beam emitters and/or the primary first-order diffracted beam based at least in part on the information.

3. The laser system of claim 2, wherein the controller is configured to control power and/or current supplied to one or more of the beam emitters based at least in part on the power and/or spectral information received from the first detection apparatus.

4. The laser system of claim 2, wherein the controller is configured to control a position and/or a tilt angle of at least one of (i) one or more of the beam emitters, (ii) the transform optics, (iii) the diffraction grating, or (iv) the output coupler based at least in part on the power and/or spectral information received from the first detection apparatus.

5. The laser system of claim 1, wherein (i) the diffraction grating is a transmissive diffraction grating, (ii) the primary first-order diffracted beam is a first-order transmission, and (iii) the secondary first-order diffracted beam is a first-order reflection.

6. The laser system of claim 1, wherein (i) the diffraction grating is a reflective diffraction grating, (ii) the primary first-order diffracted beam is a first-order reflection, and (iii) the secondary first-order diffracted beam is a first-order transmission.

7. The laser system of claim 1, wherein the diffraction grating produces, via diffraction of the incident beams, a zeroth-order transmission and/or a zeroth-order reflection.

8. The laser system of claim 7, further comprising a second detection apparatus for detecting power and/or spectral information from the zeroth-order transmission and/or the zeroth-order reflection.

9. The laser system of claim 8, wherein the controller is configured to receive the power and/or spectral information from the second detection apparatus and control the plurality of beam emitters and/or the primary first-order diffracted beam based at least in part on the information.

10. The laser system of claim 9, wherein the controller is configured to control power and/or current supplied to one or more of the beam emitters based at least in part on the power and/or spectral information received from the second detection apparatus.

11. The laser system of claim 10, wherein the controller is configured to control a position and/or a tilt angle of at least one of (i) one or more of the beam emitters, (ii) the transform optics, (iii) the diffraction grating, or (iv) the output coupler based at least in part on the power and/or spectral information received from the second detection apparatus.

12. The laser system of claim 8, wherein the second detection apparatus comprises a power detector.

13. The laser system of claim 12, wherein the power detector comprises one or more photodiodes and/or one or more thermopiles.

14. The laser system of claim 12, wherein the second detection apparatus further comprises a spectrometer.

15. The laser system of claim 8, wherein the second detection apparatus comprises a spectrometer.

16. The laser system of claim 8, wherein the second detection apparatus comprises a beam splitter for receiving the zeroth-order transmission and/or the zeroth-order reflection and supplying portions thereof to different outputs.

17. The laser system of claim 16, wherein the beam splitter comprises a fiber coupler.

18. The laser system of claim 16, further comprising a power detector coupled to a first output of the beam splitter and a spectrometer coupled to a second output of the beam splitter.

19. The laser system of claim 1, wherein the diffraction grating is tilted in a WBC plane with respect to the incident beams at a non-Littrow angle, whereby an angle between the incident beams and the diffraction grating in the WBC plane is different from an angle between the secondary first-order diffracted beam and the diffraction grating in the WBC plane.

20. The laser system of claim 1, wherein the diffraction grating is tilted in a WBC plane with respect to the incident beams at a Littrow angle, whereby an angle between the incident beams and the diffraction grating in the WBC plane is equal to an angle between the secondary first-order diffracted beam and the diffraction grating in the WBC plane.

21. The laser system of claim 20, wherein the diffraction grating is tilted in a non-WBC plane with respect to the incident beams at a non-Littrow angle, whereby an angle between the incident beams and the diffraction grating in the non-WBC plane is different from an angle between the secondary first-order diffracted beam and the diffraction grating in the non-WBC plane.

22. The laser system of claim 1, wherein the first detection apparatus comprises a power detector.

23. The laser system of claim 22, wherein the power detector comprises one or more photodiodes and/or one or more thermopiles.

24. The laser system of claim 22, wherein the first detection apparatus further comprises a spectrometer.

25. The laser system of claim 1, wherein the first detection apparatus comprises a spectrometer.

26. The laser system of claim 1, wherein the first detection apparatus comprises a beam splitter for receiving the secondary first-order diffracted beam and supplying portions of the secondary first-order diffracted beam to different outputs.

27. The laser system of claim 26, wherein the beam splitter comprises a fiber coupler.

28. The laser system of claim 26, further comprising a power detector coupled to a first output of the beam splitter and a spectrometer coupled to a second output of the beam splitter.

* * * * *